United States Patent
You et al.

(10) Patent No.: US 8,872,165 B2
(45) Date of Patent: Oct. 28, 2014

(54) THIN FILM TRANSISTOR ARRAY SUBSTRATE, ORGANIC LIGHT EMITTING DISPLAY DEVICE COMPRISING THE SAME, AND METHOD OF MANUFACTURING THE SAME

(75) Inventors: Chun-Gi You, Yongin (KR); Joon-Hoo Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 154 days.

(21) Appl. No.: 13/480,746

(22) Filed: May 25, 2012

(65) Prior Publication Data

US 2013/0126882 A1   May 23, 2013

(30) Foreign Application Priority Data

Nov. 18, 2011   (KR) .......................... 10-2011-0121196

(51) Int. Cl.
| | |
|---|---|
| *H01L 29/15* | (2006.01) |
| *H01L 35/24* | (2006.01) |
| *H01L 27/12* | (2006.01) |
| *H01L 51/52* | (2006.01) |
| *H01L 27/32* | (2006.01) |

(52) U.S. Cl.
CPC .......... *H01L 27/1255* (2013.01); *H01L 27/124* (2013.01); *H01L 51/5206* (2013.01); *H01L 27/3276* (2013.01); *H01L 27/326* (2013.01)
USPC .......... 257/40; 257/59; 257/72; 257/E33.003; 438/29; 438/34; 313/500; 313/505

(58) Field of Classification Search
CPC ...................... H01L 29/41733; H01L 51/5296
USPC ................. 257/40, 59, 72, E33.003; 438/34, 438/29–30; 313/500, 505
See application file for complete search history.

(56) References Cited

U.S. PATENT DOCUMENTS

| | | | |
|---|---|---|---|
| 2009/0141203 A1 | 6/2009 | Son et al. | |
| 2010/0193790 A1 | 8/2010 | Yeo et al. | |
| 2012/0007083 A1 | 1/2012 | You et al. | |
| 2012/0104396 A1* | 5/2012 | Pyo ................................ 257/59 |

FOREIGN PATENT DOCUMENTS

| | | |
|---|---|---|
| KR | 10-2009-0057689 | 6/2009 |
| KR | 10-2010-0088269 | 8/2010 |
| KR | 10-2012-0004785 | 1/2012 |

* cited by examiner

*Primary Examiner* — Jose R Diaz
(74) *Attorney, Agent, or Firm* — Lee & Morse, P.C.

(57) ABSTRACT

A thin film transistor array substrate includes a thin film transistor including an activation layer, a gate electrode, source and drain electrodes, a first insulation layer between the activation layer and the gate electrode, and a second insulation layer between the gate electrode and the source and drain electrodes, a pixel electrode including a transparent conductive oxide, the pixel electrode being on a portion of the first insulation layer extending from the thin film transistor and being connected to one of the source and drain electrodes via an opening in the second insulation layer, a capacitor including a first electrode and a second electrode, the first electrode being on a same layer as the activation layer and including a transparent conductive oxide, and the second electrode being between the first and second insulation layers, and a third insulation layer covering the source and drain electrodes and exposing the pixel electrode.

17 Claims, 9 Drawing Sheets

(COMPARATIVE EXAMPLE)

(COMPARATIVE EXAMPLE)

(COMPARATIVE EXAMPLE)

(COMPARATIVE EXAMPLE)

(COMPARATIVE EXAMPLE)

(COMPARATIVE EXAMPLE)

(COMPARATIVE EXAMPLE)

THIN FILM TRANSISTOR ARRAY SUBSTRATE, ORGANIC LIGHT EMITTING DISPLAY DEVICE COMPRISING THE SAME, AND METHOD OF MANUFACTURING THE SAME

CROSS-REFERENCE TO RELATED PATENT APPLICATIONS

This application claims the benefit of Korean Patent Application No. 10-2011-0121196, filed on Nov. 18, 2011, in the Korean Intellectual Property Office, the disclosure of which is incorporated herein in its entirety by reference.

BACKGROUND

1. Field

Embodiments relate to a thin film transistor array substrate, an organic light emitting display device comprising the thin film transistor array substrate, and a method of manufacturing the organic light emitting display device.

2. Description of the Related Art

Flat panel display devices such as organic light emitting display devices or liquid crystal display devices include thin film transistors (TFTs), capacitors, and wirings connecting the same. TFTs, capacitors, and wirings are formed in a fine pattern on a substrate used for manufacturing a flat panel display device. The fine pattern of the substrate is formed mainly by a photolithography process that transfers a pattern using a mask.

According to a photolithography process, a photoresist is uniformly coated on a substrate on which a pattern is to be formed. The photoresist is exposed by using an exposure apparatus such as a stepper. For positive photoresist, the exposed photoresist undergoes a development process. After the photoresist is developed, the pattern on the substrate is etched by using the remaining photoresist. After a pattern is formed, unnecessary photoresist is removed.

SUMMARY

According to an embodiment, there is provided a thin film transistor array substrate that includes a thin film transistor including an activation layer, a gate electrode, source and drain electrodes, a first insulation layer between the activation layer and the gate electrode, and a second insulation layer between the gate electrode and the source and drain electrodes, a pixel electrode including a transparent conductive oxide, the pixel electrode being on a portion of the first insulation layer extending from the thin film transistor, and the pixel electrode being connected to one of the source and drain electrodes via an opening in the second insulation layer, a capacitor including a first electrode and a second electrode, the first electrode being on a same layer as the activation layer and including a transparent conductive oxide, and the second electrode being between the first and second insulation layers, and a third insulation layer covering the source and drain electrodes and exposing the pixel electrode.

The first electrode may include a semiconductor doped with ion impurities.

The thin film transistor array substrate may further include a connection portion connected to the first electrode, wherein the semiconductor doped with ion impurities may be present continuously between the first electrode and the connection portion.

The transparent conductive oxide may include at least one of indium tin oxide (ITO), indium zinc oxide (IZO), zinc oxide (ZnO), indium oxide ($In_2O_3$), indium gallium oxide (IGO), and aluminum zinc oxide (AZO).

The gate electrode may directly contact the first insulation layer. The gate electrode may include a first layer including molybdenum (Mo), a second layer including aluminum (Al), and a third layer including molybdenum (Mo).

The thin film transistor array substrate may further include a signal wiring on a same layer as the gate electrode and formed of a same material as the gate electrode, the signal wiring directly contacting the first insulation layer.

The pixel electrode may further include a semi-transmitting metal layer.

The semi-transmitting metal layer may be between layers of the transparent conductive oxide.

A gap may exist between the pixel electrode and the second insulation layer.

The pixel electrode and one of the source and drain electrodes may be connected through a layer including a same material as the gate electrode.

The second electrode and the second insulation layer may directly contact each other.

According to an embodiment, there is provided an organic light emitting display device, including a thin film transistor including an activation layer, a gate electrode, source and drain electrodes, a first insulation layer between the activation layer and the gate electrode, and a second insulation layer between the gate electrode and the source and drain electrodes, a pixel electrode including a transparent conductive oxide, the pixel electrode being on a portion of the first insulation layer extending from the thin film transistor, and the pixel electrode being connected to one of the source and drain electrodes via an opening in the second insulation layer, a capacitor including a first electrode and a second electrode, the first electrode being on a same layer as the activation layer and including a transparent conductive oxide, and the second electrode being between the first and second insulation layers, a third insulation layer covering the source and drain electrodes and exposing the pixel electrode, an organic light emitting layer on the pixel electrode, and an opposed electrode on the organic light emitting layer.

The opposed electrode may be a reflection electrode for reflecting light irradiated from the organic light emitting layer.

According to an embodiment, there is provided a method of manufacturing a thin film transistor array substrate, the method including a first mask process of forming a semiconductor layer on a substrate and forming an activation layer of a thin film transistor and a first electrode of a capacitor by patterning the semiconductor layer, a second mask process of forming a first insulation layer, forming a transparent conductive oxide layer on the first insulation layer, and forming a pixel electrode and a second electrode of a capacitor by patterning the transparent conductive oxide layer, a third mask process of forming a first metal layer, forming a gate electrode of a thin film transistor, and forming a metal connection layer on the pixel electrode, a fourth mask process of forming a second insulation layer, forming a source area and a drain area of the activation layer on the second insulation layer, and forming an opening for exposing the pixel electrode, a fifth mask process of forming a second metal layer and forming a source electrode and a drain electrode connected to the source area and the drain area by patterning the second metal layer, and a sixth mask process of forming a third insulation layer and removing the third insulation layer to expose the pixel electrode.

In the third mask process, the gate electrode may be formed to directly contact the first insulation layer.

The first mask process may further form a connection portion connected to the first electrode and, after the third mask process, ion impurities are doped in the source area and the drain area, the first electrode, and the connection portion connected to the first electrode.

In the fourth mask process, a gap may be formed between the second insulation layer and the pixel electrode.

In the fifth mask process, the metal connection layer on the pixel electrode may be removed.

The fifth mask process may include a first etching process that etches the second metal layer and a second etching process that etches the metal connection layer.

BRIEF DESCRIPTION OF THE DRAWINGS

Features will become more apparent by describing in detail exemplary embodiments thereof with reference to the attached drawings in which.

DETAILED DESCRIPTION

Figure 1:
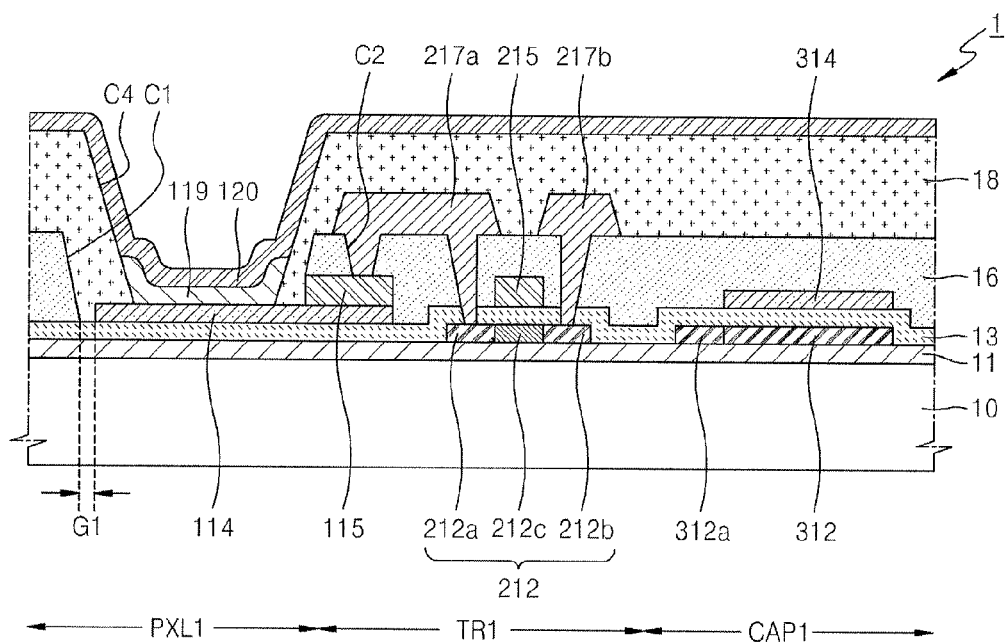
FIG. 1 is a cross-sectional view schematically illustrating an organic light emitting display device according to an embodiment.

The attached drawings for illustrating exemplary embodiments are referred to in order to gain a sufficient understanding, the merits thereof, and the objectives accomplished by the implementation. Hereinafter, the present invention will be described in detail by explaining exemplary embodiments of the invention with reference to the attached drawings. Like reference numerals in the drawings denote like elements.

As used herein, the term "and/or" includes any and all combinations of one or more of the associated listed items. Expressions such as "at least one of," when preceding a list of elements, modify the entire list of elements and do not modify the individual elements of the.

FIG. 1 is a cross-sectional view schematically illustrating an organic light emitting display device 1 according to an embodiment. Referring to FIG. 1, the organic light emitting display device 1 according to the present embodiment includes a substrate 10 on which a pixel area PXL1, a transistor area TR1, and a capacitor area CAP1 are provided.

The substrate 10 may be a glass substrate or a transparent plastic substrate including polyethylene terephthalate (PET), polyethylene naphthalate (PEN), polyimide, etc.

A buffer layer 11 may be provided on the substrate 10. The buffer layer 11 forms a flat surface on an upper portion of the substrate 10 so as to prevent intrusion of impurities. The buffer layer 11 may be formed of silicon nitride and/or silicon oxide as a single layer or multiple layers.

An activation layer 212 is provided on the buffer layer 11. The activation layer 212 may be formed of semiconductor including amorphous silicon or crystalline silicon. The activation layer 212 may include a channel area 212c, and a source area 212a and a drain area 212c provided besides the channel area 212c and doped with ion impurities.

A gate electrode 215 is provided on the activation layer 212 at a position corresponding to the channel area 212c of the activation layer 212 with a first insulation layer 13 that is a gate insulation layer and interposed between the activation layer 212 and the gate electrode 215. The gate electrode 215 may be formed of at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium(Li), calcium (Ca), molybdenum (Mo), titanium (Ti), tungsten (W), and copper (Cu), as a single layer or as multiple layers.

If the gate electrode 215 were to be formed in multiple layers by further including a layer 214 (refer to FIG. 3) having a transparent conductive oxide under the gate electrode 215 as in an organic light emitting display device 3 according to a comparative example (refer to FIG. 4), which will be described below, in addition to the above-described material, an undercut may be generated between the gate electrode 215 and the layer 214 having transparent conductive oxide, during patterning, so that step coverage may be deteriorated. After a second insulation layer 16 that is an interlayer dielectric is formed, cracks may be generated in the second insulation layer 16 and thus a short circuit may be generated.

A signal wiring (not shown), for example, a scan signal wiring, of the same material as the gate electrode 215 may be further formed on the first insulation layer 13. If the layer 215 having transparent conductive oxide (refer to FIG. 3) were to be further formed under a signal wiring (not shown), an adhesion state between the layer 214 having transparent conductive oxide and the second insulation layer 16 may be inferior so that the layer 214 having transparent conductive oxide may be lifted.

However, in the organic light emitting display device 1 according to the present embodiment, since the gate electrode 215 and the signal wiring are formed directly on the first insulation layer 13, the generation of an undercut during patterning of the gate electrode 215 and generation of lifting of the signal wiring may be prevented so that a defect of the organic light emitting display device may be prevented.

A source electrode 217a and a drain electrode 217b respectively connected to the source area 212a and a drain area 212b of the activation layer 212 are provided on the gate electrode 215, with the second insulation layer 16 that is an interlayer dielectric interposed therebetween. A third insulation layer 18 is provided on the second insulation layer 16 to cover the source electrode 217a and the drain electrode 217b.

The first insulation layer 13 and the second insulation layer 16 may be provided as inorganic insulation layers. The third insulation layer 18 may be provided as a single layered organic insulation layer or as both an inorganic insulation layer and an organic insulation layer. The third insulation layer 18 may include a common commercial polymer such as a polymethyl methacrylate (PMMA) or a polystyrene (PS), a polymer derivative having a phenol group, an acrylic based polymer, an imide based polymer, an aryl ether based polymer, an amide based polymer, a fluorine based polymer, a p-xylene based polymer, a vinyl alcohol based polymer, and blends thereof.

A pixel electrode 114 formed of the same material as the second electrode 314 of a capacitor that will be described below is provided on the first insulation layer 13 in a pixel area PXL1 according to the present embodiment.

The pixel electrode 114 may be formed of transparent conductive oxide and may emit light. The transparent conductive oxide may include at least one of indium tin oxide (ITO), indium zinc oxide (IZO), zinc oxide (ZnO), indium oxide ($In_2O_3$), indium gallium oxide (IGO), and aluminum zinc oxide (AZO).

The pixel electrode 114 is connected to one of the source electrode 217a and the drain electrode 217b via an opening C2 formed in the second insulation layer 16. A portion where the pixel electrode 114 is connected to one of the source electrode 217a and the drain electrode 217b is formed as a metal connection layer 115 including the same metal as the gate electrode 215. Since the pixel electrode 114 formed of transparent conductive oxide has a large resistance, the pixel electrode 114 is connected to one of the source electrode 217a and the drain electrode 217b via the metal connection layer 115 that has a small resistance.

An opening C1 is formed in the second insulation layer 16 so as to form a gap G1 between the pixel electrode 114 and the second insulation layer 16, that is, the second insulation layer 16 does not cover the outer portion of the pixel electrode 114. As a result, an aspect ratio of the organic light emitting display device 1 may be increased.

The third insulation layer 18 is formed outside the pixel electrode 114. An opening C4 for exposing the pixel electrode 114 is formed in the third insulation layer 18. An organic light emitting layer 119 is formed in the opening Cl.

The organic light emitting layer 119 may be a low molecular organic material or a polymer organic material. When the organic light emitting layer 119 is a low molecular organic material, a hole transport layer (HTL), a hole injection layer (HIL), an electron transport layer (ETL), and an electron injection layer (EIL) may be stacked with respect to the organic light emitting layer 119. In addition, various layers may be stacked as desired. A usable organic material may include copper phthalocyanine (CuPc), N'-di(naphthalene-1-yl)-N, N'-diphenyl-benzidine (NPB), tris-8-hydroxyquinoline aluminum (Alq3), etc. When the organic light emitting layer 119 is a polymer organic material, an HTL may be included in addition to the organic light emitting layer 119. Poly-(3,4)-ethylene-dihydroxy thiophene (PEDOT), polyaniline (PANI), etc. may be used as the HTL. A usable organic material may include a polymer organic material such as poly-phenylenevinylene (PPV) based materials and polyfluorene based materials.

An opposed electrode 120 is stacked as a common electrode on the organic light emitting layer 119. The opposed electrode 120 may be provided as a reflection electrode. The opposed electrode 120 may be formed as a reflection electrode including a reflection material. The opposed electrode 120 may include at least one material selected from aluminum (Al), magnesium (Mg), lithium (Li), calcium (Ca), LiF/Ca, and LiF/Al. If the opposed electrode 120 is provided as a reflection electrode, light irradiated from the organic light emitting layer 119 is reflected from the opposed electrode 120 and passes through the pixel electrode 114 formed of transparent conductive oxide to proceed toward the substrate 10.

In the organic light emitting display device 1 according to the present embodiment, the pixel electrode 114 is used as an anode and the opposed electrode 120 is used as a cathode. The polarity of an electrode may be reversely applied. A first electrode 312 of a capacitor formed of the same material as the activation layer 212 of a thin film transistor (TFT) and a connection portion 312a connected to the first electrode 312 are provided on the buffer layer 11 in the capacitor area CAP1.

The first electrode 312 may include semiconductor doped with ion impurities as the same material as the source area 212a and the drain area 212b of the activation layer 212. If the first electrode 312 is formed of an intrinsic semiconductor, a capacitor along with the second electrode 314 may have a metal oxide semiconductor (MOS) CAP structure. However, if the first electrode 312 is formed as semiconductor doped with ion impurities as in the present embodiment, the capacitor forms a metal-insulator-metal (MIM) CAP structure so that electrostatic capacitance may be increased. Thus, the MIM CAP structure may realize the same electrostatic capacitance with an area smaller than the MOS CAP structure. As a result, as a margin for reducing the area of a capacitor increases, the pixel electrode 114 may be formed large so as to increase an aspect ratio.

The connection portion 312a is arranged on the same layer as the first electrode 312 and is connected to the first electrode 312 to transfer a signal (current/voltage) that is located outside the first electrode 312. The connection portion 312a, like the first electrode 312, may include semiconductor doped with ion impurities. The ion impurities may be continuously distributed between the first electrode 312 and the connection portion 312a.

The second electrode 314 is provided on an upper surface of the first insulation layer 13. The second electrode 314, like the pixel electrode 114, is formed of transparent conductive oxide.

The second insulation layer 16 is formed on the second electrode 314 to directly contact the same. The third insulation layer 18 is formed on the second insulation layer 16. The second insulation layer 16 and the third insulation layer 18 may be provided between the second electrode 314 and the opposed electrode 120. Accordingly, parasitic capacitance between the second electrode 314 and the opposed electrode 120 may be reduced.

Figure 2A:
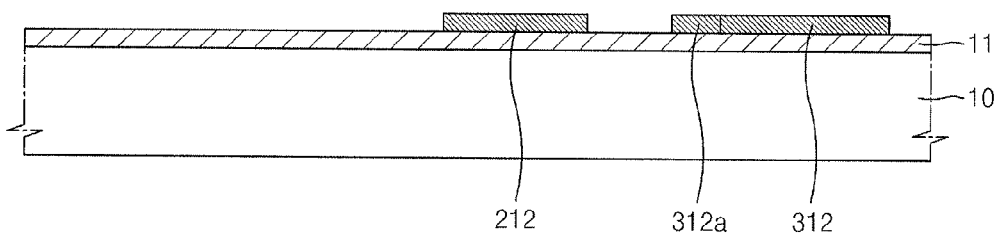
FIG. 2A is a cross-sectional view schematically illustrating a result of a first mask process of the organic light emitting display device of FIG. 1.

A method of manufacturing the organic light emitting display device 1 according to an embodiment is now described with reference to FIGS. 2A through 2E. FIG. 2A is a cross-sectional view schematically illustrating a result of a first mask process of the organic light emitting display device 1 of FIG. 1.

Referring to FIG. 2A, the buffer layer 11 and a semiconductor layer (not shown) are sequentially formed on the substrate 10. The activation layer 212 of a TFT, the first electrode 312 of a capacitor, and the connection portion 312a are formed by patterning the semiconductor layer.

Although it is not illustrated in the above drawings, the buffer layer 11 and the semiconductor layer are stacked on the substrate 10. After a photoresist (not shown) is coated on the semiconductor layer, the semiconductor layer is patterned by a photolithography process using a first photomask (not shown). As a result of pattering, the above-described activation layer 212, the first electrode 312, and the connection portion 312a are formed. The first mask process using photolithography is performed through a series of processes of developing, etching, striping or ashing, etc. after the first photomask is exposed by an exposure apparatus (not shown).

The semiconductor layer may be formed of amorphous silicon or polysilicon. The polysilicon may be formed by crystallizing amorphous silicon. A method of crystallizing amorphous silicon may include various methods such as a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method.

Figure 2B:
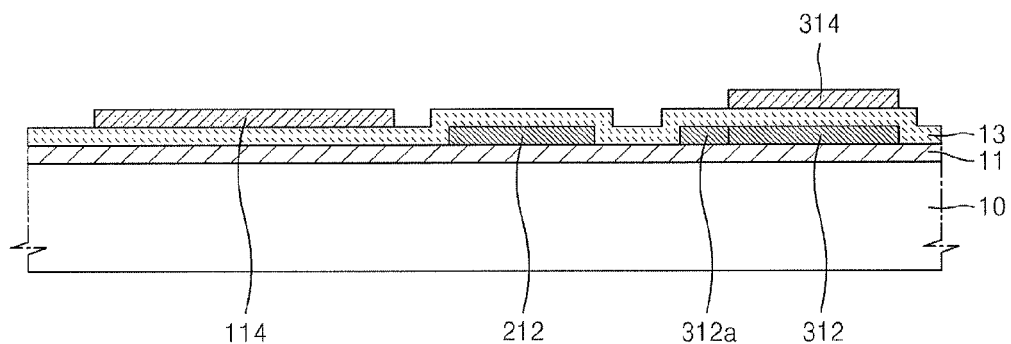
FIG. 2B is a cross-sectional view schematically illustrating a result of a second mask process of the organic light emitting display device of FIG. 1.

FIG. 2B is a cross-sectional view schematically illustrating a result of a second mask process of the organic light emitting display device 1 of FIG. 1. Referring to FIG. 2B, the first insulation layer 13 and a layer (not shown) including transparent conductive oxide are sequentially stacked on a resultant of the first mask process of FIG. 2A and then are patterned.

The first insulation layer 13 may be formed of an inorganic insulation layer selected from $SiO_2$, $SiN_X$, SiON, $Al_2O_3$, $TiO_2$, $Ta_2O_5$, $HfO_2$, $ZrO_2$, BST, and PZT. The layer including a transparent conductive oxide may include at least one of indium tin oxide (ITO), indium zinc oxide (IZO), zinc oxide (ZnO), indium oxide ($In_2O_3$), indium gallium oxide (IGO), and aluminum zinc oxide (AZO).

As a result of patterning, the pixel electrode 114 and the second electrode 314 of a capacitor are formed on the first insulation layer 13. The first insulation layer 13 may include $SiO_2$ or $SiN_X$ in a single layer or multiple layers. The first insulation layer 13 may function as a gate insulation layer of a TFT and a dielectric layer of a capacitor.

Figure 2C:
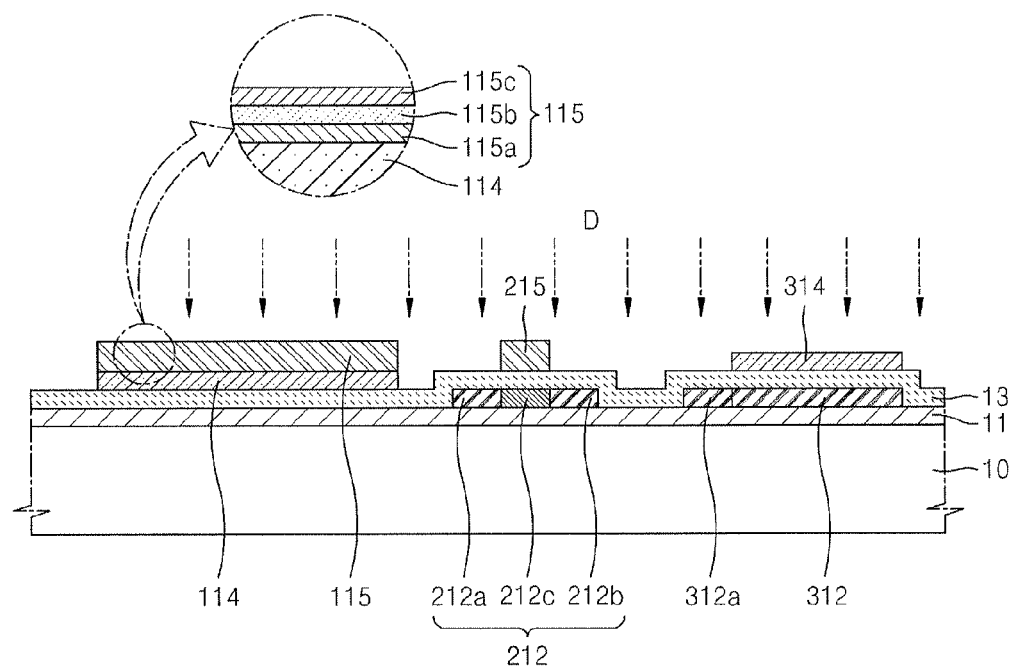
FIG. 2C is a cross-sectional view schematically illustrating a result of a third mask process of the organic light emitting display device of FIG. 1.

FIG. 2C is a cross-sectional view schematically illustrating a result of a third mask process of the organic light emitting display device 1 of FIG. 1. Referring to FIG. 2C, a first metal layer (not shown) is formed on a resultant of the second mask process of FIG. 2B and then is patterned.

The first metal layer may be formed of aluminum (Al), platinum (Pt), palladium (Pd), silver (Ag), magnesium (Mg), gold (Au), nickel (Ni), neodymium (Nd), iridium (Ir), chromium (Cr), lithium(Li), calcium (Ca), molybdenum (Mo), titanium (Ti), tungsten (W), or copper (Cu), as a single layer or multiple layers.

As a result of patterning, the first metal layer is formed as the gate electrode 215 of a TFT and the metal connection layer 115 located on the pixel electrode 114. In FIG. 2C, the gate electrode 215 is illustrated to include a first layer 215a including molybdenum (Mo), a second layer 215b including aluminum (Al), and a third layer 215c including molybdenum (Mo).

The gate electrode 215 may be formed as only a layer including the above-described low resistance metal without a layer including transparent conductive oxide. Accordingly, the generation of an undercut may be prevented during the patterning of the gate electrode 214. Also, like a scan signal wiring, a signal wiring (not shown) may be directly formed of the same material as the gate electrode 215 on the first insulation layer 13. Accordingly, the generation of lifting due to the patterning of the signal wiring may be prevented.

Ion impurities are doped in the above-described structure. The ion impurities may be B or P ions and are doped at a concentration of $1 \times 10^{15}$ atoms/$cm^2$ or higher in a target structure of the activation layer 212 of a TFT, the first electrode 312, and the connection portion 312a.

By doping the ion impurities in the activation layer 212 using the gate electrode 215 as a self-align mask, the source area 212a and the drain area 212b where the ion impurities are doped, and the channel area 212c therebetween, are formed in the activation layer 212.

The first electrode 312 and the connection portion 312a formed of the same material as the activation layer 212 are simultaneously doped with the activation layer 212. According to the present embodiment, the source area 212a and the drain area 212b of the activation layer 212, the first electrode 312, and the connection portion 312a may be simultaneously doped in a one-time doping process. Accordingly, the manufacturing process may be simplified and the manufacturing costs may be reduced.

Figure 2D:
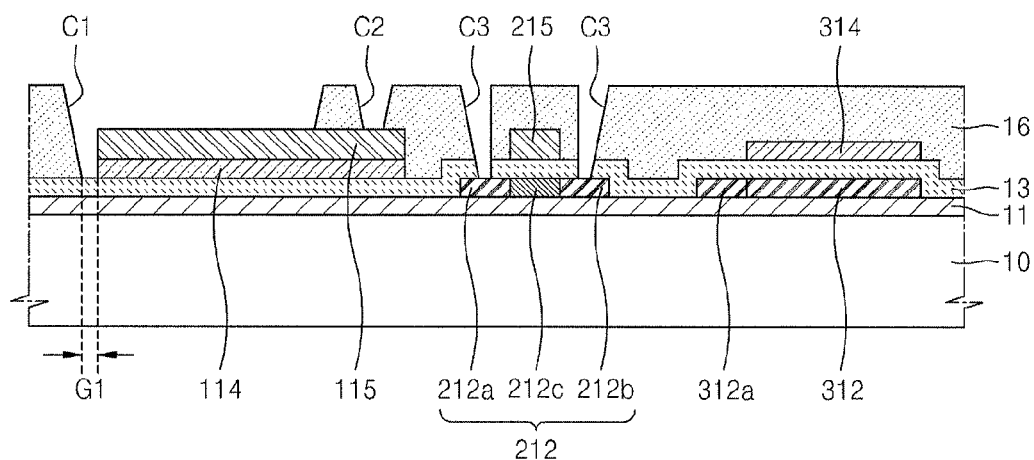
FIG. 2D is a cross-sectional view schematically illustrating a result of a fourth mask process of the organic light emitting display device of FIG. 1.

FIG. 2D is a cross-sectional view schematically illustrating a result of a fourth mask process of the organic light emitting display device 1 of FIG. 1. Referring to FIG. 2D, the second insulation layer 16 is formed on a resultant of the third mask process of FIG. 2C. The opening C1 for exposing the pixel electrode 114, the opening C2 for connecting the pixel electrode 114 and one of the source electrode 217a and the drain electrode 217b, and an opening C3 for partially exposing the source and drain areas 212a and 212b of the activation layer 212 are formed by patterning the second insulation layer 16.

The opening C1 is patterned to allow the gap G1 to be formed between the pixel electrode 114 and the second insulation layer 16 so that the second insulation layer 16 does not cover the outside of the pixel electrode 114. As described above, the aspect ratio of the organic light emitting display device 1 may be increased.

Figure 2E:
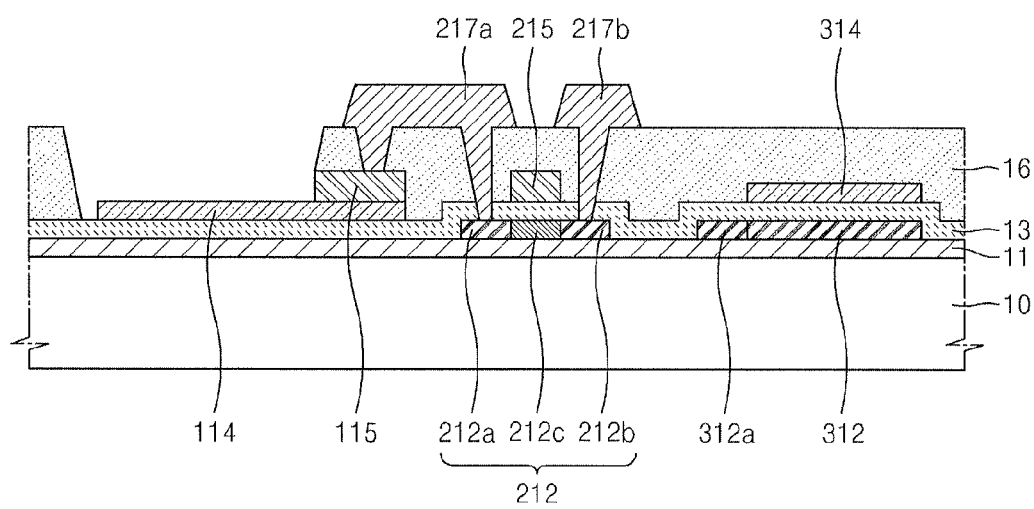
FIG. 2E is a cross-sectional view schematically illustrating a result of a fifth mask process of the organic light emitting display device of FIG. 1.

FIG. 2E is a cross-sectional view schematically illustrating a result of a fifth mask process of the organic light emitting display device 1 of FIG. 1. Referring to FIG. 2E, a second metal layer (not shown) is formed on a resultant of the fourth mask process of FIG. 2E. The source electrode 217a and the drain electrode 217b are formed as a result of patterning.

The second metal layer may be formed of at least one of metal selected from aluminum (Al), platinum (Pt), palladium (Pd), silver (Ag), magnesium (Mg), gold (Au), nickel (Ni), neodymium (Nd), iridium (Ir), chromium (Cr), lithium(Li), calcium (Ca), molybdenum (Mo), titanium (Ti), tungsten (W), and copper (Cu), as a single layer or multiple layers.

One of the source electrode 217a and the drain electrode 217b is electrically connected to the pixel electrode 114 via the opening C2. In the present embodiment, the source electrode 217a and the drain electrode 217b may be patterned after the pixel electrode 114 is formed. Accordingly, the connection portion 312a of the source electrode 217a or the drain electrode 217b connected to the pixel electrode 114 may be formed on the pixel electrode 114. Also, during the patterning of the source electrode 217a and the drain electrode 217b the metal connection layer 115 disposed on the pixel electrode 114 is removed and a pattern for only the metal connection layer 115 between the pixel electrode 114 and the connection portion remains.

When the metal for forming the source electrode 217a and the drain electrode 217b and the metal for forming the metal connection layer 115 are the same material, the metal connection layer 115 on the pixel electrode 114 may be removed by a one-time etching process using the same etchant and thus the source electrode 217a and the drain electrode 217b may be patterned. If the metal for forming the source electrode 217a and the drain electrode 217b and the metal for forming the metal connection layer 115 are different from each other, a pattern for the source electrode 217a and the drain electrode 217b may be formed by a first etching process and the metal connection layer 115 on the pixel electrode 114 may be removed by a second etching process.

Figure 2F:
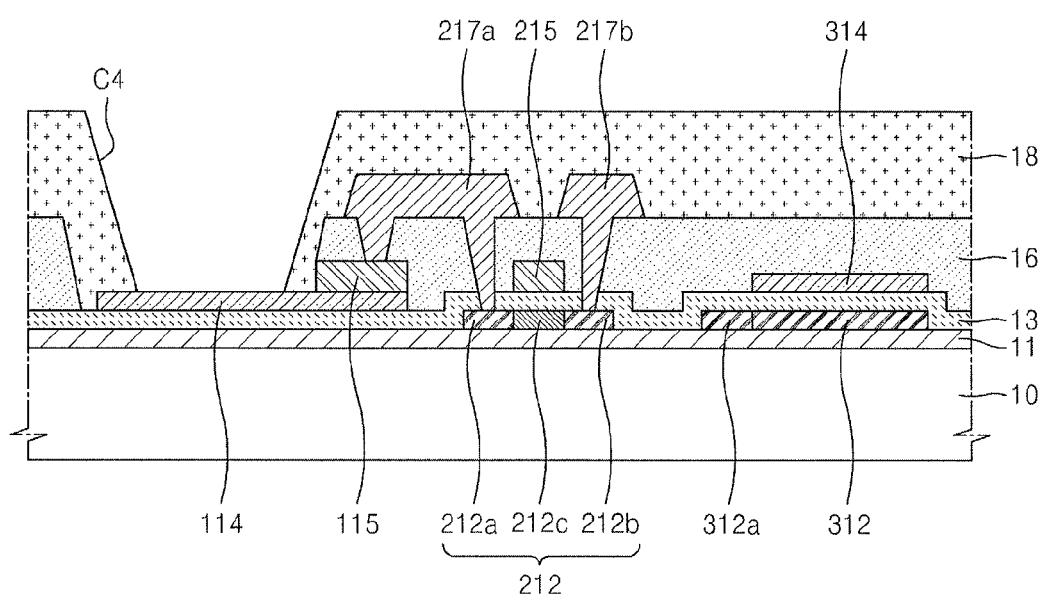
FIG. 2F is a cross-sectional view schematically illustrating a result of a sixth mask process of the organic light emitting display device of FIG. 1.

FIG. 2F is a cross-sectional view schematically illustrating a result of a sixth mask process of the organic light emitting display device 1 of FIG. 1. Referring to FIG. 2F, after the third insulation layer 18 is formed on a resultant of the fifth mask process of FIG. 2E, the opening C4 for exposing an upper portion of the pixel electrode 114 is formed.

Figure 3:
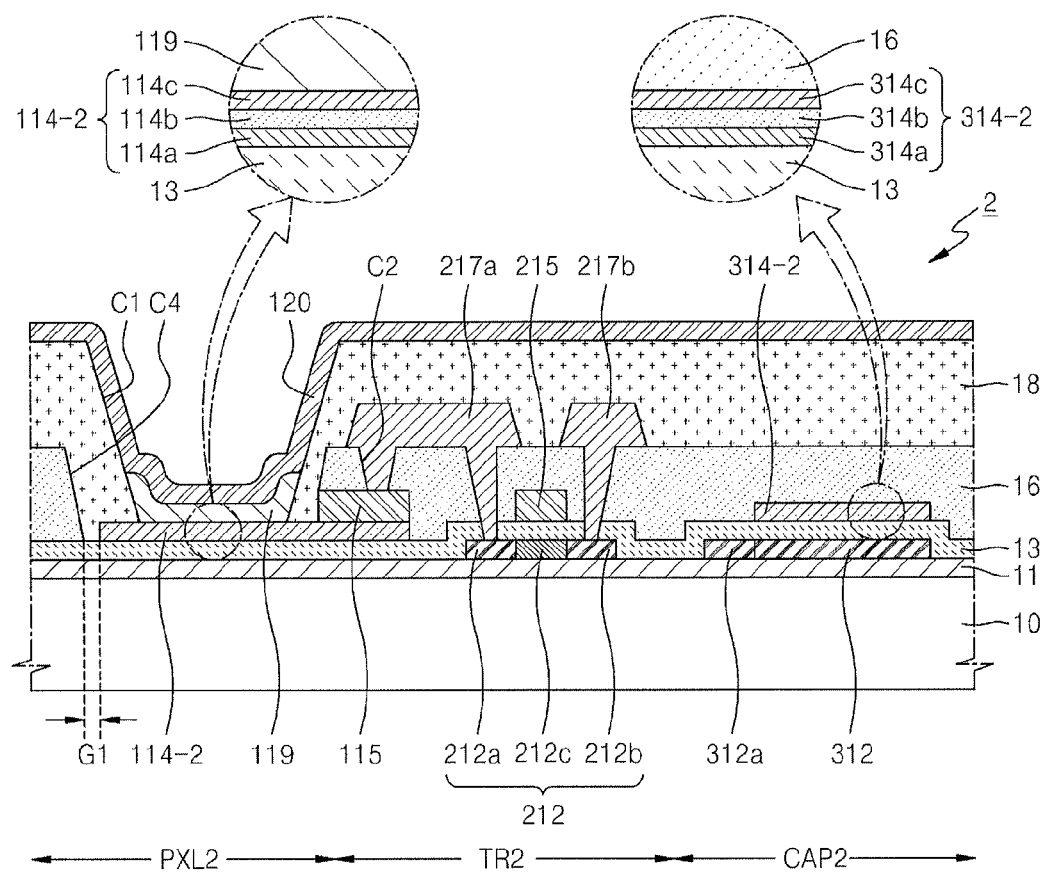
FIG. 3 is a cross-sectional view schematically illustrating an organic light emitting display device according to another embodiment.

FIG. 3 is a cross-sectional view schematically illustrating an organic light emitting display device 2 according to another embodiment. Here, only differences from the above-described embodiment will be discussed with reference to FIG. 3.

Referring to FIG. 3, a pixel area PXL2, a transistor area TR2, a capacitor area CAP2, and a pad area PAD2 are formed on the substrate 10 of the organic light emitting display device 2 of the present embodiment. The transistor area TR2 is the same as that of the organic light emitting display device 1 according to the above-described embodiment.

In the pixel area PXL2, a pixel electrode 114-2 is formed above the substrate 10 and the buffer layer 11. The organic light emitting layer 119 is formed on the pixel electrode 114-2. The light irradiated from the organic light emitting layer 119 proceeds toward the substrate 10 through the pixel electrode 114-2.

In the organic light emitting display device 2 according to the present embodiment, the pixel electrode 114-2 may further include a layer including a semitransparent metal in addition to the above-described layer including transparent conductive oxide. For example, the pixel electrode 114-2 may include the first layer 114a (see FIG. 2B) including transparent conductive oxide, the second layer 114b (see FIG. 2B) including semitransparent metal, and the third layer 114c (see FIG. 2B) including transparent conductive oxide. The semitransparent metal forming the second layer 114b may be selected from silver (Ag), aluminum (Al), and an alloy thereof.

The first layer 114a including a transparent conductive oxide may reduce adhesion stress between the first insulation layer 13 and the second layer 114b including a semi-transparent metal. The third layer 114c including a transparent conductive oxide may reduce a work function difference between the second layer 114b including the semitransparent metal and the second layer 114b and the organic light emitting layer 119, for example, organic layers such as an HIL.

The opposed electrode 120 functions as a mirror and the second layer 114b including semitransparent metal functions as a semi-transmitting mirror, so that the light irradiated from the organic light emitting layer 119 resonates between the opposed electrode 120 and the second layer 114b including the semi-transmitting metal. Accordingly, light efficiency of the organic light emitting display device 2 according to the present embodiment may be improved due to the resonance. In order for the layer 114b including the semi-transmitting metal to function as a resonance mirror, the layer 114b may have a thickness of about 300 Å or less.

The substrate 10, the first electrode 312, and a second electrode 314-2 are formed in the capacitor area CAP2. The second electrode 314-2 includes a first layer 314a including transparent conductive oxide, a second layer 314b including semi-transmitting metal, and a third layer 314c including transparent conductive oxide. This structure is the same as that of the above-described pixel electrode 114-2.

The first insulation layer 13 functioning as a dielectric layer is formed between the first and second electrodes 312 and 314-2. The second and third insulation layers 16 and 18 are formed on the second electrode 314-2.

Figure 4:
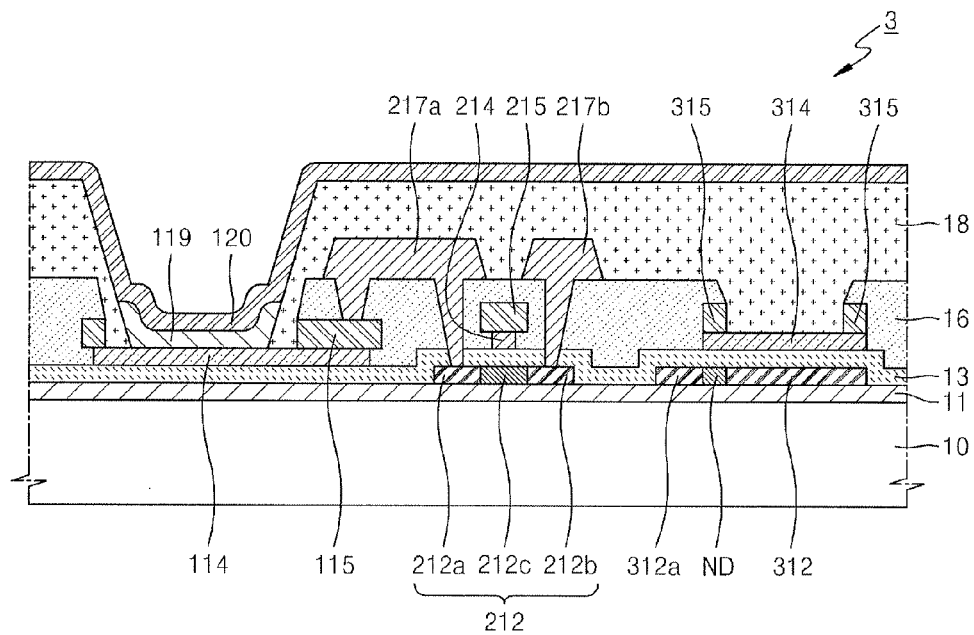
FIG. 4 is a cross-sectional view schematically illustrating an organic light emitting display device according to a comparative example.

FIG. 4 is a cross-sectional view schematically illustrating an organic light emitting display device 3 according to a comparative example. The organic light emitting display device 3 according to the first comparative example includes a pixel area PXL3, a transistor area TR3, and a capacitor area CAP3.

In the pixel area PXL3, the second insulation layer 16 has a small aspect ratio because it covers the outside of the pixel electrode 114. In the transistor area TR3, the gate electrodes 214 and 215 include the layer 214 including transparent conductive oxide and the layer 215 including low resistance metal. Accordingly, during patterning, an undercut may be generated between the layer 214 including the transparent conductive oxide and the layer 215 including low-resistance metal so that the step coverage may be deteriorated. Thus, after the second insulation layer 16 that is an interlayer dielectric is formed, cracks may be generated in the second insulation layer during a thermal treatment process so that short circuit may be generated.

Also, when a signal wiring (not shown) is formed on the first insulation layer 13 of the same material as the gate electrodes 214 and 215, an adhesion state between the layer including transparent conductive oxide and the first insulation layer 13 may become inferior so that a phenomenon of lifting may be generated in the layer including transparent conductive oxide.

In the capacitor area CAP3, the second insulation layer 16 is formed to cover the outside of the second electrode 315 and ion impurities are not continuously doped in the first electrode 312 and the connection portion 312a. That is, an area ND where no ion impurities are doped is formed between the first electrode 312 and the connection portion 312a so that resistance of a capacitor may be increased and signal transmission quality may be deteriorated.

Figure 5A:
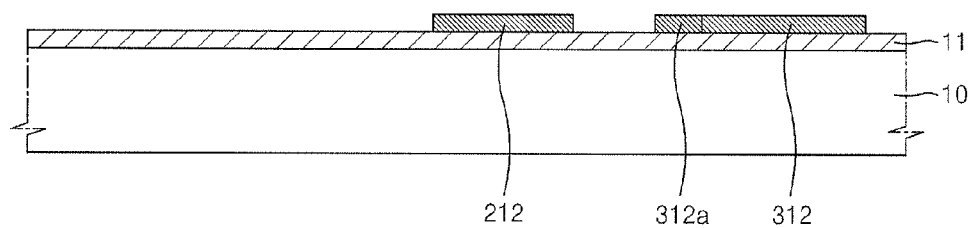
FIGS. 5A through 5E are cross-sectional views schematically illustrating a manufacturing process of the organic light emitting display device of FIG. 4.

FIGS. 5A through 5E are cross-sectional views schematically illustrating a manufacturing process of the organic light emitting display device 3 of FIG. 4. Referring to FIG. 5A, the activation layer 212 where no ion impurities are doped and the first electrode 312 and the connection portion 312a where no ion impurities are doped are formed on the substrate 10.

Figure 5B:
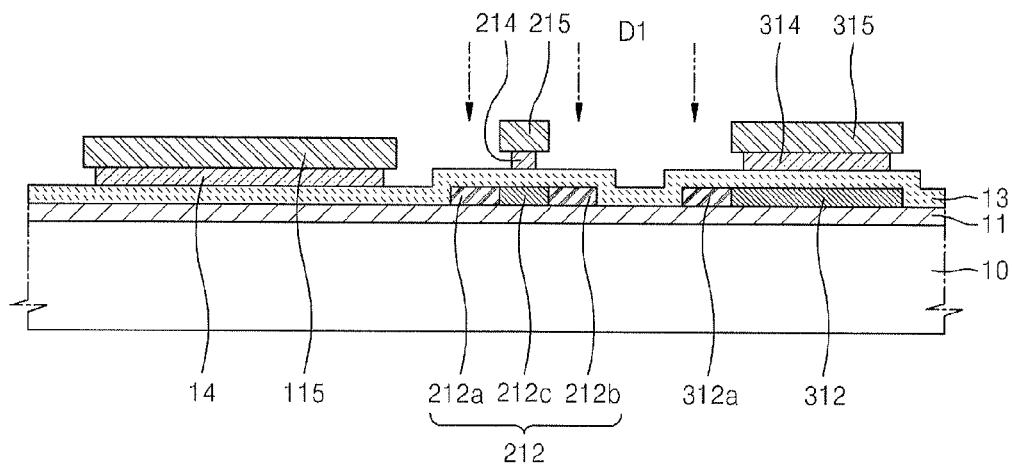

Referring to FIG. 5B, a layer including transparent conductive oxide and a layer including low resistance metal are sequentially stacked and patterned and thus the pixel electrodes 114 and 115, the gate electrodes 214 and 215, and the first electrodes 314 and 315 of a capacitor are formed and then a first doping D1 is performed. As a result, the activation layer 212 is provided with the source and drain areas 212a and 212b, where ion impurities are doped, and the channel area 212c. Since the second electrodes 314 and 315 function as a blocking mask, the first electrode 312 blocked by the second electrodes 314 and 315 is not doped whereas the connection portion 312a is doped. In the gate electrodes 214 and 215, during patterning, an undercut may be generated between the layer 214 including transparent conductive oxide and the layer 215 including low resistance metal so that the step coverage may be deteriorated. Also, when a signal wiring (not shown) is formed of the same material as the gate electrodes 214 and 215, an adhesion state between the layer 214 having transparent conductive oxide and the first insulation layer 13 may be inferior so that the layer 214 having transparent conductive oxide may be lifted.

Figure 5C:
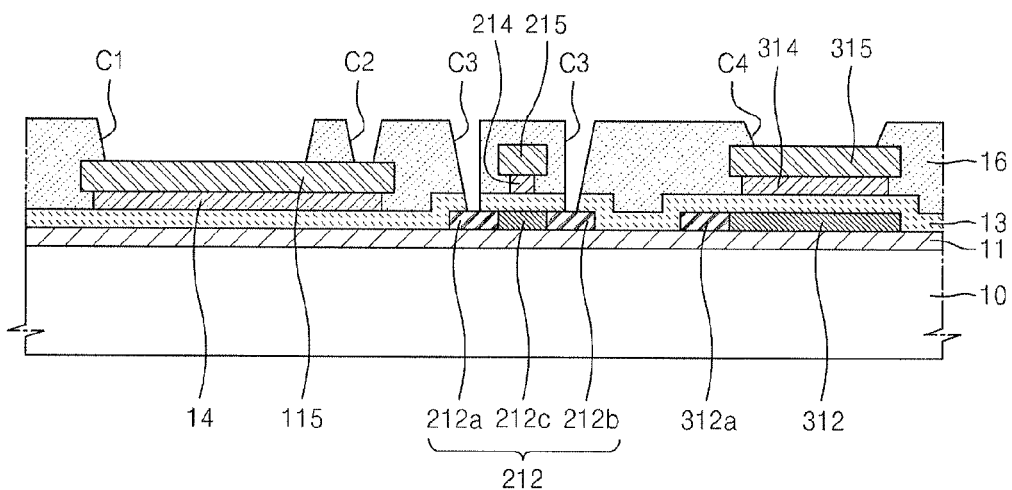

Referring to FIG. 5C, the second insulation layer 16 is formed and then the opening C1 for exposing the pixel electrodes 114 and 115, the opening C2 for connecting the pixel electrodes 114 and 115 and the source or drain electrode, the opening C3 for partially exposing the source area 212a and the drain area 212b of the activation layer 212, and the opening C4 for exposing the second electrodes 314 and 315 are formed. The second insulation layer 16 forms the opening C4 in a manner of not exposing the whole of the upper electrodes 314 and 315 and slightly cladding the edges thereof.

Figure 5D:
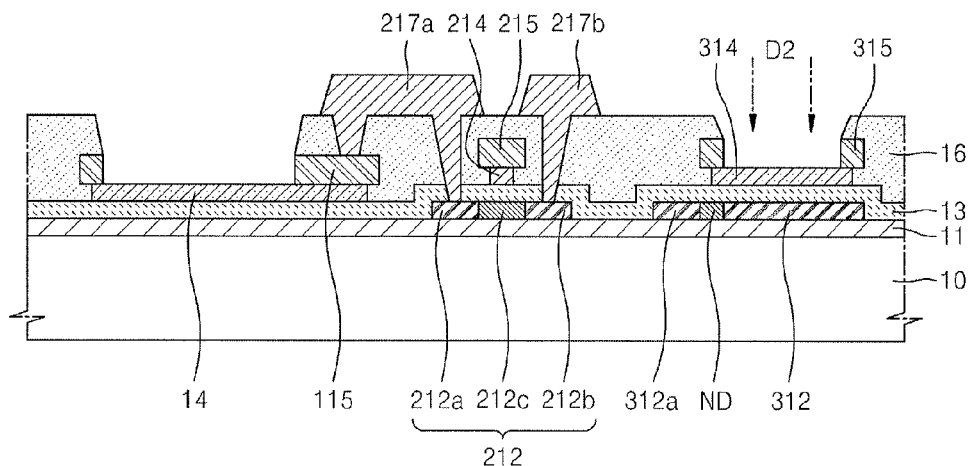

Referring to FIG. 5D, the second metal layer (not shown) is stacked on a resultant of the third mask process of FIG. 5C, filling the above-described openings C1, C2, C3, and C4, and is patterned so as to form the source and drain electrodes 217a and 217b. An upper layer 115 of the pixel electrodes 114 and 115 and the upper layer 315 of the second electrode are removed together. Since the second insulation layer 16 covers the edge of the upper layer 315 of the second electrode, the upper layer 315 covered by the second insulation layer 16 remains. Then, a second doping D2 is performed. After the second doping D2, although the second electrode 312 is doped, the area ND corresponding to the remaining upper layer 315 is undoped. Thus, resistance of the capacitor area CAP3 may be increased so that signal quality may be deteriorated.

Figure 5E:
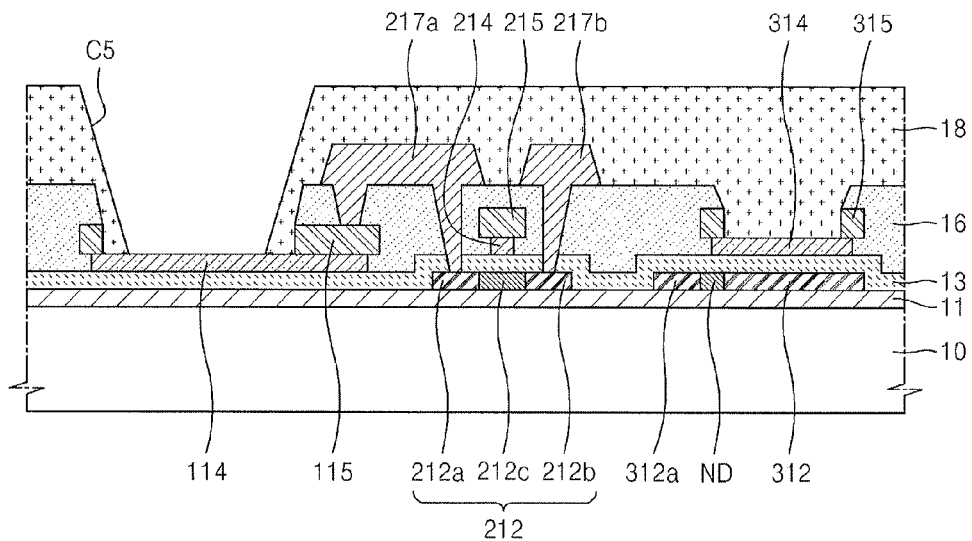

Referring to FIG. 5E, after the third insulation layer 18 is stacked on a resultant of the fourth mask process, the third insulation layer 18 is patterned so as to form an opening C5 for exposing an upper portion of the pixel electrode 114. Thus, according to the first comparative example, the area ND undoped with ion impurities may be generated between the first electrode 312 and the connection portion 312a, and thus, the area ND may have increased resistance so that the signal transfer quality of a capacitor may be deteriorated.

Figure 6:
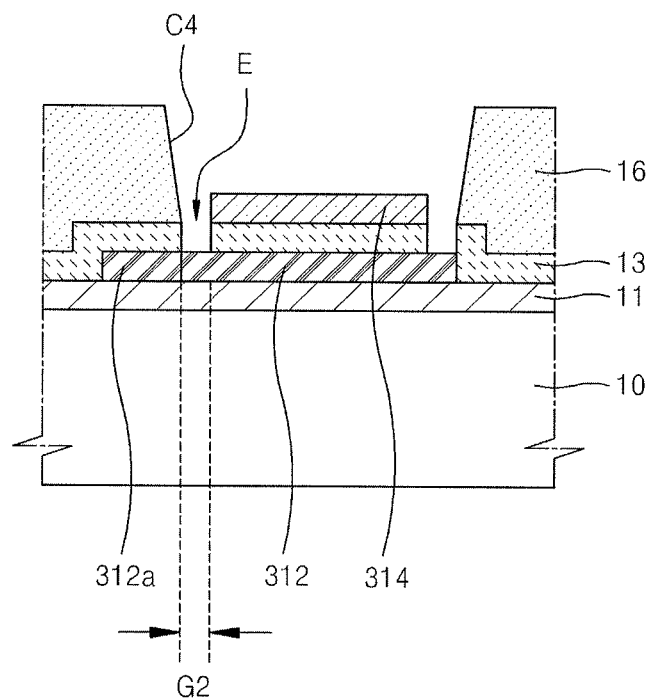
FIG. 6 is a cross-sectional view schematically illustrating a capacitor area in a third mask process of a organic light emitting display device according to another comparative example.

FIG. 6 is a cross-sectional view schematically illustrating a capacitor area in a third mask process of a organic light emitting display device according to another comparative example. Unlike the above-described first comparative example, in the third mask process, when the second insulation layer 16 exposes the whole of the second electrodes 314 and 315, that is, a gap G2 is formed between the second insulation layer 16 and the second electrode 314, the area ND (see FIG. 4) undoped with ion impurities is not generated between the first electrode 312 and the connection portion 312a.

However, when the second insulation layer 16 is patterned to form the openings C1, C2, C3, and C4 (see FIG. 4) in the third mask process, the first insulation layer 13 in a capacitor area CAP4 is etched together. In doing so, the first insulation layer 13 on the upper surface of the activation layer 212 is etched, thereby generating an exposed area E. In a process of depositing a metal layer and then removing the same to form a source electrode and a drain electrode in the fourth mask process that is a subsequent process, silicide may be formed between semiconductor and the metal layer for forming the first electrode 312 in the exposed area E. The silicide may cause a generation of a short-circuit between the first and second electrodes 312 and 314 so that a dark spot defect of a display device may be generated.

In order to address the problem according to the above-described second comparative example, if the gap G2 is patterned by using a half-tone mask having a semi-transmitting portion, the exposed area E may not be generated in the gap G2. However, the patterning of a narrow area corresponding to the gap G2 by using a half-tone mask greatly reduces a process margin so that it is not easy to solve the above problem.

The thin film transistor array substrate, an organic light emitting display device comprising the thin film transistor array substrate, and a method of manufacturing the organic light emitting display device, according to the present invention may advance the art by providing the following effects.

Generation of undercut during patterning of a gate electrode may be prevented so that device characteristics of a thin film transistor may be improved.

Ion impurities may be continuously doped in a capacitor lower electrode and a connection portion thereof so that signal transfer quality of a capacitor may be improved.

A source area and a drain area, and a lower electrode of a capacitor and a connection portion thereof, may be simultaneously doped by a one-time doping process.

The organic light emitting display device may be manufactured by only six mask processes. In this regard, in a process of transferring a pattern using a mask, a mask having a necessary pattern must prepared so that the manufacturing costs increases as the number of processes using masks increases. Also, since many operations are needed, a manufacturing process is complicated, manufacturing time increases, and manufacturing costs increase.

In contrast, embodiments may provide a thin film transistor array substrate and an organic light emitting display device having a simple manufacturing process and exhibiting superior signal transfer capability.

While various aspects have been particularly shown and described with reference to exemplary embodiments thereof, it will be understood by those skilled in the art that various changes in form and details may be made therein without departing from the spirit and scope of the invention as defined by the appended claims.

What is claimed is:

1. A thin film transistor array substrate, comprising:
    a thin film transistor including an activation layer, a gate electrode, source and drain electrodes, a first insulation layer between the activation layer and the gate electrode, and a second insulation layer between the gate electrode and the source and drain electrodes;
    a pixel electrode including a transparent conductive oxide, the pixel electrode being on a portion of the first insulation layer extending from the thin film transistor, and the pixel electrode being connected to one of the source and drain electrodes via an opening in the second insulation layer;
    a capacitor including a first electrode and a second electrode, the first electrode being on a same layer as the activation layer and including a semiconductor doped with ion impurities, the second electrode being between the first and second insulation layers and including a transparent conductive oxide;
    a third insulation layer covering the source and drain electrodes and exposing the pixel electrode; and
    a connection portion connected to the first electrode, the connection portion disposed on a same layer as the first electrode, wherein the semiconductor doped with ion impurities is present continuously between the first electrode and the connection portion.

2. The thin film transistor array substrate of claim 1, wherein the transparent conductive oxide includes at least one of indium tin oxide, indium zinc oxide, zinc oxid, indium oxide, indium gallium oxide, and aluminum zinc oxide.

3. The thin film transistor array substrate of claim 1, wherein the gate electrode directly contacts the first insulation layer.

4. The thin film transistor array substrate of claim 1, wherein the gate electrode includes a first layer including molybdenum (Mo), a second layer including aluminum (Al), and a third layer including molybdenum (Mo).

5. The thin film transistor array substrate of claim 1, further comprising a signal wiring on a same layer as the gate electrode and formed of a same material as the gate electrode, the signal wiring directly contacting the first insulation layer.

6. The thin film transistor array substrate of claim 1, wherein the pixel electrode further includes a semi-transmitting metal layer.

7. The thin film transistor array substrate of claim 6, wherein the semi-transmitting metal layer is between layers of the transparent conductive oxide.

8. The thin film transistor array substrate of claim 1, wherein a gap exists between the pixel electrode and the second insulation layer.

9. The thin film transistor array substrate of claim 1, wherein the pixel electrode and one of the source and drain electrodes are connected through a layer including a same material as the gate electrode.

10. The thin film transistor array substrate of claim 1, wherein the second electrode and the second insulation layer directly contact each other.

11. An organic light emitting display device, comprising:
   a thin film transistor including an activation layer, a gate electrode, source and drain electrodes, a first insulation layer between the activation layer and the gate electrode, and a second insulation layer between the gate electrode and the source and drain electrodes;
   a pixel electrode including a transparent conductive oxide, the pixel electrode being on a portion of the first insulation layer extending from the thin film transistor, and the pixel electrode being connected to one of the source and drain electrodes via an opening in the second insulation layer;
   a capacitor including a first electrode and a second electrode, the first electrode being on a same layer as the activation layer and including a semiconductor doped with ion impurities, and the second electrode being between the first and second insulation layers and including a transparent conductive oxide;
   a third insulation layer covering the source and drain electrodes and exposing the pixel electrode;
   an organic light emitting layer on the pixel electrode;
   an opposed electrode on the organic light emitting layer; and
   a connection portion connected to the first electrode, the connection portion disposed on a same layer as the first electrode, wherein the semiconductor doped with ion impurities is present continuously between the first electrode and the connection portion.

12. The organic light emitting display device of claim 11, wherein the opposed electrode is a reflection electrode for reflecting light irradiated from the organic light emitting layer.

13. A method of manufacturing a thin film transistor array substrate, the method comprising:
   a first mask process of forming a semiconductor layer on a substrate and forming an activation layer of a thin film transistor and a first electrode of a capacitor by patterning the semiconductor layer;
   a second mask process of forming a first insulation layer, forming a transparent conductive oxide layer on the first insulation layer, and forming a pixel electrode and a second electrode of a capacitor by patterning the transparent conductive oxide layer;
   a third mask process of forming a first metal layer, forming a gate electrode of a thin film transistor, and forming a metal connection layer on the pixel electrode;
   a fourth mask process of forming a second insulation layer, forming a source area and a drain area of the activation layer on the second insulation layer, and forming an opening for exposing the pixel electrode;
   a fifth mask process of forming a second metal layer and forming a source electrode and a drain electrode connected to the source area and the drain area by patterning the second metal layer; and
   a sixth mask process of forming a third insulation layer and removing the third insulation layer to expose the pixel electrode;
   wherein the first mask process further forms a connection portion connected to the first electrode and, after the third mask process, ion impurities are doped in the source area and the drain area, the first electrode, and the connection portion connected to the first electrode.

14. The method of claim 13, wherein, in the third mask process, the gate electrode is formed to directly contact the first insulation layer.

15. The method of claim 13, wherein, in the fourth mask process, a gap is formed between the second insulation layer and the pixel electrode.

16. The method of claim 13, wherein, in the fifth mask process, the metal connection layer on the pixel electrode is removed.

17. The method of claim 16, wherein the fifth mask process includes a first etching process that etches the second metal layer and a second etching process that etches the metal connection layer.

* * * * *